(12) United States Patent
Kawate et al.

(10) Patent No.: US 9,230,873 B2
(45) Date of Patent: Jan. 5, 2016

(54) SEMICONDUCTOR PACKAGE RESIN COMPOSITION AND USAGE METHOD THEREOF

(75) Inventors: Kohichiro Kawate, Machinda (JP); Hiroko Akiyama, Kanagawa (JP); Naota Sugiyama, Kanagawa (JP); Brant U. Kolb, Afton, MN (US); Eric G. Larson, Lake Elmo, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/131,827

(22) PCT Filed: Jul. 9, 2012

(86) PCT No.: PCT/US2012/045916
§ 371 (c)(1),
(2), (4) Date: Apr. 17, 2014

(87) PCT Pub. No.: WO2013/012587
PCT Pub. Date: Jan. 24, 2013

(65) Prior Publication Data
US 2014/0217622 A1    Aug. 7, 2014

Related U.S. Application Data

(60) Provisional application No. 61/508,344, filed on Jul. 15, 2011.

(51) Int. Cl.
*H01L 21/60* (2006.01)
*H01L 23/29* (2006.01)
*C08L 63/00* (2006.01)
*H01L 23/10* (2006.01)
*H01L 21/56* (2006.01)
(Continued)

(52) U.S. Cl.
CPC ............. *H01L 23/296* (2013.01); *C08K 3/36* (2013.01); *C08K 9/06* (2013.01); *C08L 63/00* (2013.01); *H01L 21/563* (2013.01); *H01L 23/10* (2013.01); *H01L 23/293* (2013.01);
(Continued)

(58) Field of Classification Search
CPC ............. H01L 2224/16225; H01L 23/295; H01L 2924/0665; H01L 21/563; H01L 33/56
USPC ........................................................ 257/793
See application file for complete search history.

(56) References Cited

U.S. PATENT DOCUMENTS 6,228,681 B1    5/2001    Gilleo
6,245,595 B1    6/2001    Nguyen
(Continued)

FOREIGN PATENT DOCUMENTS

EP          1595919         8/2012
JP          2008-297373     12/2008
KR          10-2010-0098320 9/2010

OTHER PUBLICATIONS

Su, P. et al., "The Effects of Underfill on the Reliability of Flip Chip Solder Joints", Journal of Electronic Materials, 1999, vol. 28, No. 9, pp. 1017-1022.
(Continued)

*Primary Examiner* — Howard Weiss
*Assistant Examiner* — Tifney Skyles
(74) *Attorney, Agent, or Firm* — Adam Bramwell; Ann Gallagher

(57) ABSTRACT

A semiconductor package resin composition of the present invention includes an epoxy resin, a curing agent, inorganic particles, nano-particles surface treated with a silane that contains a photopolymerizable functional group, and a photopolymerization initiator.

5 Claims, 7 Drawing Sheets

(51) Int. Cl.
*C08K 3/36* (2006.01)
*C08K 9/06* (2006.01)
*H01L 33/56* (2010.01)

(52) U.S. Cl.
CPC .............. *H01L 23/295* (2013.01); *H01L 33/56* (2013.01); *H01L 2224/16225* (2013.01); *H01L 2224/32225* (2013.01); *H01L 2224/48091* (2013.01); *H01L 2224/48227* (2013.01); *H01L 2224/73204* (2013.01); *H01L 2224/92125* (2013.01)

(56) References Cited

U.S. PATENT DOCUMENTS

| | | |
|---|---|---|
| 6,281,046 B1 | 8/2001 | Lam |
| 2002/0146861 A1 | 10/2002 | Standing |
| 2002/0190370 A1 | 12/2002 | Shi |
| 2003/0111519 A1 | 6/2003 | Kinney |
| 2003/0129421 A1 | 7/2003 | Terauchi |
| 2003/0162911 A1 | 8/2003 | Xiao |
| 2005/0131106 A1 | 6/2005 | Tonapi |
| 2006/0147719 A1 | 7/2006 | Rubinsztajn |
| 2006/0194064 A1 | 8/2006 | Xiao |
| 2008/0280392 A1 | 11/2008 | Stapleton |
| 2009/0140284 A1 | 6/2009 | Kurino |
| 2009/0142884 A1 | 6/2009 | Katoh |
| 2012/0045594 A1 | 2/2012 | Chang |
| 2012/0059086 A1* | 3/2012 | Nelson et al. .................. 523/340 |

OTHER PUBLICATIONS

International Search Report for PCT International Application No. PCT/US2012/045916 Mailed on Jan. 28, 2013, 5 pages.

* cited by examiner

SEMICONDUCTOR PACKAGE RESIN COMPOSITION AND USAGE METHOD THEREOF

CROSS REFERENCE TO RELATED APPLICATIONS

This application is a national stage filing under 35 U.S.C. 371 of PCT/US2012/045916, filed Jul. 9, 2012, which claims priority to U.S. Provisional Application No. 61/508,344, filed Jul. 15, 2011, the disclosure of which is incorporated by reference in its/their entirety herein.

BACKGROUND

Conventionally, a variety of resins have been used in semiconductor packages as sealing agents such as underfilling agents and overmolding agents. An underfilling agent is disposed between a substrate and an electronic component (for example, a semiconductor chip, resistor, capacitor, inductor, transistor, or the like) so as to connect the substrate to the electronic component. The electronic component and the substrate are electrically connected via solder bumps. Because the underfilling agent is filled by means of a capillary phenomenon between the substrate, the solder bumps and the electronic component, the underfilling agents generally have low viscosities. However, in order to ensure that the components are reliably connected, it is essential that following curing, the underfilling agent has an appropriate range for the module, coefficient of thermal expansion, and glass transition point (Tg). Peng Su et al. reported in the *Journal of Electronic Materials*, Vol. 28, No. 9, 1999, page 1017 that appropriate ranges are, for example, 7 to 20 GPa, 20 to 40 ppm, and 60 to 120° C. respectively.

In recent years, semiconductor packages have been subjected to three-dimensional integration in which semiconductor chips are laminated and wiring is carried out in the vertical direction. Semiconductor packages having a variety of structures in three dimensions have also appeared. For example, in a semiconductor package such as that shown in FIG. 1, a first electronic component (11) is electrically connected to a substrate (14) via solder bumps (13), and a second electronic component (12) disposed on the upper part of the first electronic component is electrically connected to the substrate by bonding wires (15). In this type of semiconductor package, because problems such as connection defects can occur if the edge of an underfilling agent (16) extends to where the bonding wire (15) contacts the substrate, the position of the edge must be precisely controlled by adjusting the fluidity of the underfilling agent.

Another solution is to use an overmolding agent to connect the substrate to the electronic component, as shown in FIG. 2. In the embodiment of FIG. 2, an electronic component (21) disposed on a substrate (24) via solder bumps (23) is covered by an overmolding agent (26). In order for the edge (261) of the overmolding agent (26) not to have an adverse effect on an element other than the substrate, such as a bonding wire, the position of edge (261) must be controlled.

In addition, semiconductor package resin compositions have been directly coated on semiconductor wafers before dicing into semiconductor chips in recent years in order to increase the efficiency of semiconductor chip production processes. U.S. Patent Application Publication No. US 2006/0194064 A1 describes a curable underfill encapsulant composition that is directly coated on a semiconductor wafer before the wafer is diced into individual chips. This underfilling agent is coated on a semiconductor wafer, B-stage solidification is carried out at a temperature of approximately 100° C. to approximately 150° C. before final complete curing, and a smooth, non-tacky solid coating is formed in order to dice the wafer into individual chips. The wafer is then diced into individual chips, a B-stage processed chip having an underfilling agent is disposed on a substrate in a state whereby this underfilling agent is adjacent to the substrate, and final complete curing is carried out at a second temperature, which is higher than the B-stage conversion temperature.

SUMMARY

A beneficial product attribute of a semiconductor package resin composition of the present invention includes an appropriate range for the module, coefficient of thermal expansion, and glass transition point (Tg) in order to achieve a low viscosity when used on a substrate or electronic component; the ability to adjust the viscosity (fluidity) of the composition following application; and the ability to ensure reliability of connection between a substrate and an electronic component or between electronic components following complete curing. In addition, in cases where a part of a semiconductor package disposed on the surface of a substrate or electronic component is subjected to B-stage conversion (that is, sufficient curing is carried out for the composition to soften but not melt when heated) in order to adjust the fluidity thereof and another part is not subjected to B-stage conversion, another beneficial product attribute includes both parts having a similar module, coefficient of thermal expansion, and glass transition point (Tg) even when both parts are subjected to final curing by heating.

In one aspect, the present disclosure provides a semiconductor package resin composition, the fluidity of which can be adjusted by curing through irradiation with light and which can ensure reliable connection between a substrate and an electronic component or between electronic components by carrying out final curing by heating.

In one embodiment, the present disclosure includes a semiconductor package resin composition that contains an epoxy resin, a curing agent, inorganic particles, and nano-particles surface treated with a silane that contains a photopolymerizable functional group.

In another embodiment, the present disclosure provides a method for producing a semiconductor package, which includes (1) providing at least one of an electronic component and a substrate, (2) disposing a first semiconductor package resin composition on the electronic component and/or substrate, wherein the semiconductor package resin composition contains an epoxy resin, a curing agent, inorganic particles, and nano-particles surface treated with a silane that contains a photocrosslinkable group, (3) irradiating at least part of the first semiconductor package resin composition with light during a B-stage conversion, and (4) curing of the first semiconductor package resin composition by heating.

DETAILED DESCRIPTION

Figure 1:
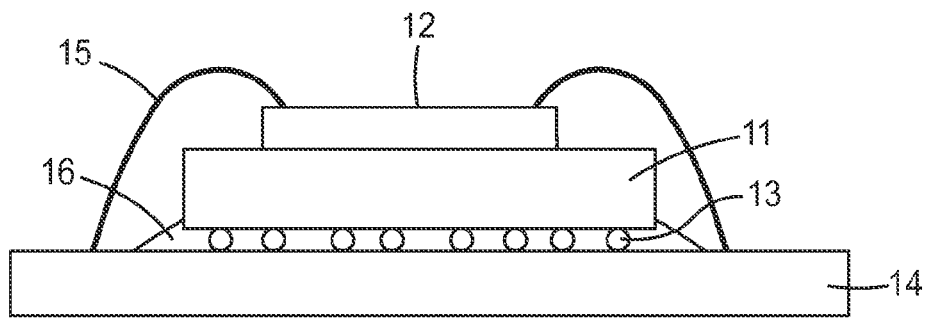
FIG. 1 is a cross-sectional view of a prior art semiconductor package.

All numbers are herein assumed to be modified by the term "about." The recitation of numerical ranges by endpoints includes all numbers subsumed within that range (e.g., 1 to 5 includes 1, 1.5, 2, 2.75, 3, 3.80, 4, and 5). All parts recited herein are by weight unless otherwise indicated.

Epoxy resins suitable for use in the semiconductor package resin composition of the present invention include, but are not limited to: aliphatic, alicyclic, aromatic, or heterocyclic monomeric, or oligomeric epoxy compounds. These materials generally have, on average, at least one polymerizable epoxy group per molecule, and may have at least 1.5 or at least 2 polymerizable epoxy groups per molecule. In certain modes, it is possible to use a polyfunctional epoxy compound having three or four polymerizable epoxy groups per molecule. The epoxy compound may be a pure compound or may be a mixture of compounds containing one, two, or more epoxy groups per molecule.

The epoxy compounds mentioned above may have any type of main chain and may contain substituent groups. Examples of suitable substituent groups include, but are not limited to: halogens, ester groups, ethers, sulfonate groups, siloxane groups, nitro groups, phosphate groups, and the like. The epoxy equivalent value of the epoxy compound can generally be altered within the range 50 to 2000.

Examples of oligomeric epoxy compounds include, but are not limited to: linear oligomers having terminal epoxy groups (for example, a diglycidyl ether of a polyoxyalkylene glycol), oligomers having skeletal epoxy units (for example, polybutadiene polyepoxide), or oligomers having pendant epoxy groups (for example, a glycidyl methacrylate oligomer or co-oligomer).

In certain modes, it is possible to use a glycidyl ether monomer represented by the following formula.

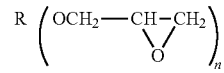

In the formula, R is a radical having a valency of n and n is an integer between 1 and 6. R can be an aromatic group, an alicyclic group, aliphatic group or a combination thereof. Typical epoxy compounds include, but are not limited to, glycidyl ethers of polyhydric phenols obtained by reacting a polyhydric phenol with an excess of a chlorohydrin such as epichlorohydrin (for example, 2,2-bis-(2,3-epoxypropoxyphenol)-propane). In particular, it is possible to use an aromatic epoxy compound, an alicyclic epoxy compound, an aliphatic epoxy compound, and the like.

Suitable aromatic epoxy compounds include, but are not limited to: a diglycidyl ether of bisphenol A (bisphenol A type epoxy resin), a diglycidyl ether of bisphenol F (bisphenol F type epoxy resin), a diglycidyl ether of 4,4'-dihydroxybiphenyl, oligomers of these diglycidyl ethers, polyglycidyl ethers of cresol novolac resins (cresol novolac type epoxy resins), and polyglycidyl ethers of phenol novolac resins (phenol novolac type epoxy resins).

Exemplary alicyclic epoxy compounds include, but are not limited to, compounds obtained by hydrogenating the aromatic epoxy compounds mentioned above, such as hydrogenated bisphenol A type epoxy compounds and hydrogenated bisphenol F type epoxy compounds. In addition, it is possible to use compounds containing a cyclohexene oxide group, such as vinyl cyclohexene monoxide, 1,2-epoxy-4-vinyl cyclohexane, 1,2:8,9-diepoxylimonene, 3,4-epoxycyclohexenylmethyl-3',4'-epoxycyclohexene carboxylate and epoxy cyclohexane carboxylates such as 3,4-epoxycyclohexenylmethyl-3,4-epoxycyclohexane carboxylate, 3,4-epoxy-2-methylcyclohexylmethyl-3,4-epoxy-2-methylcyclohexane carboxylate, and bis(3,4-epoxy-6-methylcyclohexylmethyl) adipate.

Suitable aliphatic epoxy compounds include, but are not limited to, glycidyl ethers of aliphatic polyhydric alcohols or alkylene oxide adducts thereof. For example, ethylene glycol diglycidyl ether, di(ethylene glycol)diglycidyl ether, propylene glycol diglycidyl ether, tri(propylene glycol)diglycidyl ether, neopentyl glycol diglycidyl ether, 1,4-butane diol diglycidyl ether, 1,6-hexane diol diglycidyl ether, trimethylolpropane triglycidyl ether, trimethylolpropane diglycidyl ether, poly(ethylene glycol)diglycidyl ether, and the like can be cited as examples thereof.

In addition to the epoxy resins mentioned above, it is possible to use a halogenated epoxy resin (such as a brominated bisphenol type epoxy resin) or an epoxy compound having a glycidylamino group. Epoxy compounds having a glycidylamino group are epoxy compounds (epoxy resins) obtained by epoxidizing amines through the action of an epihalohydrin, and examples thereof include aminophenol type epoxy resins, triglycidyl isocyanurates, tetraglycidyl diaminodiphenylmethane, tetraglycidyl meta-xylenediamine, and hexaglycidyl triaminobenzene.

Aminophenol type epoxy resins are obtained by epoxidizing aminophenols using methods known to those of skill in the art. Examples of aminophenols include, but are not limited to, aminophenols and aminocresols such as 2-aminophenol, 3-aminophenol, 4-aminophenol, 2-amino-m-cresol, 2-amino-p-cresol, 3-amino-o-cresol, 4-amino-m-cresol, and 6-amino-m-cresol.

Other epoxy resins suitable for use include copolymers of acrylic acid esters of glycidol (such as glycidyl acrylate and glycidyl methacrylate) with one or more copolymerizable vinyl compounds. This type of copolymer includes styreneglycidyl methacrylate and methyl methacrylate-glycidyl acrylate copolymers. In addition, it is also possible to use an epoxy-functional silicon, which is a polydimethyl siloxane in which silicon atoms have been substituted with epoxyalkyl groups.

Of the epoxy resins mentioned above, it is preferable to use a bisphenol A type epoxy resin, a bisphenol F type epoxy resin, or an aminophenol type epoxy resin from the perspective of characteristics after final curing of the semiconductor package resin composition. In addition, from the perspective of obtaining a balance between the viscosity of the semiconductor package resin composition and the characteristics after final curing, it is preferable to use both a bisphenol A type epoxy resin and a bisphenol F type epoxy resin or a three-component system obtained by further adding an aminophenol type epoxy resin to a bisphenol A type epoxy resin and a bisphenol F type epoxy resin. Specifically, it is possible to use the product ZX1059 (produced by Nippon Steel Chemical Co., Ltd., a mixture of bisphenol A and bisphenol F) or the aminophenol type epoxy jER® 630 (produced by Mitsubishi Chemical Corporation), both of which are commercially available.

The blending quantity of the epoxy resin is generally 50 mass % or less, and 10 to 40 mass % in some modes, relative to the total quantity of the semiconductor package resin composition.

The curing agent contained in the semiconductor package resin composition of the present invention can be a curing agent commonly used to thermally cure epoxy compounds. Specific examples thereof include, but are not limited to: amino compounds, acid anhydride compounds, amide compounds, phenolic compounds, trifluorinated boron complex compounds such as BF3-monoethanolamine, imidazoles such as 2-ethyl-4-methylimidazole, hydrazides such as aminodihydrazide, guanidines such as tetramethylguanidine, and dicyandiamide. The curing agent can be a single curing agent or a mixture of different curing agents. From the perspective of viscosity, an acid anhydride compound is preferred.

It is suitable to use a non-aromatic acid anhydride compound. For example, it is suitable to use hexahydrophthalic acid anhydride, 3-methylhexahydrophthalic acid anhydride, 4-methylhexahydrophthalic acid anhydride, 1-methylnorbornane-2,3-dicarboxylic acid anhydride, 5-methylnorbornane-2,3-dicarboxylic acid anhydride, norbornane-2,3-dicarboxylic acid anhydride, 1-methylnadic acid anhydride, 5-methylnadic acid anhydride, nadic acid anhydride, tetrahydrophthalic acid anhydride, 3-methyltetrahydrophthalic acid anhydride, 4-methyltetrahydrophthalic acid anhydride, dodecenylsuccinic acid anhydride, and the like.

Of these, particularly suitable are hexahydrophthalic acid anhydride, 3-methylhexahydrophthalic acid anhydride, 4-methylhexahydrophthalic acid anhydride, 1-methylnorbornane-2,3-dicarboxylic acid anhydride, 5-methylnorbornane-2,3-dicarboxylic acid anhydride, or norbornane-2,3-dicarboxylic acid anhydride, which do not have a double bond in the compound. A mixture of 4-methylhexahydrophthalic acid anhydride and hexahydrophthalic acid anhydride (such as Rikacid MH-700 produced by New Japan Chemical Co., Ltd. (4-methylhexahydrophthalic acid anhydride/hexahydrophthalic acid anhydride ratio=70/30) is particularly suitable due to a semiconductor package resin composition that contains this mixture having a low viscosity and hardly crystallizing.

Exemplary phenol-based curing agents include, but are not limited to: bisphenol A, bisphenol F, bisphenol S, 4,4'-biphenylphenol, tetramethyl bisphenol A, dimethyl bisphenol A, tetramethyl bisphenol F, dimethyl bisphenol F, tetramethyl bisphenol S, dimethyl bisphenol S, tetramethyl-4,4'-biphenol, dimethyl-4,4'-biphenylphenol, 1-(4-hydroxyphenyl)-2-[4-phenyl]propane, 2,2'-methylene-bis(4-methyl-6-tert-butylphenol), 4,4'-butylidene-bis(3-methyl-6-tert-butylphenol), trishydroxyphenylmethane, resorcinol, hydroquinone, pyrogallol, diisopropylidene, phenols having a terpene skeleton, phenols having a fluorene skeleton such as 1,1-di-4-hydroxyphenylfluorene, phenolated polybutadienes, phenol, cresols, ethylphenols, butylphenols, octylphenols, and novolac resins such as novolac resins obtained using phenols such as bisphenol A, bisphenol F, bisphenol S, naphthols, terpene diphenols, and the like as raw materials, phenol novolac resins having a xylylene skeleton, phenol novolac resins having a dicyclopentadiene skeleton, phenol novolac resins having a biphenyl skeleton, phenol novolac resins having a fluorene skeleton, and phenol novolac resins having a furan skeleton.

Exemplary amino-based curing agents include, but are not limited to: aliphatic amines such as diethylenetriamine, triethylenetetramine, or tetraethylenepentamine, aromatic amines such as diaminodiphenylmethane, diaminodiphenylsulfone, meta-xylenediamine, and condensation products of aromatic amines and aldehydes, polyamidoamines.

From the perspective of the characteristics of the obtained cured product, the blending quantity of the curing agent is approximately equal to the blending quantity of the epoxy resin. In general, the blending quantity of the curing agent is 5 to 15 mass %, relative to the total weight of the semiconductor package resin composition.

The inorganic particles are dispersed substantially homogeneously in the semiconductor package resin composition of the present invention. The inorganic particles are used in order to impart the semiconductor package resin composition with a high modulus of elasticity and a low coefficient of thermal expansion, and it is possible to use a single type or a combination of two or more types of inorganic particles. In general, these inorganic particles can be a powder such as silica (molten silica, crystalline silica), alumina, calcium silicate, calcium carbonate, potassium titanate, silicon carbide, silicon nitride, aluminum nitride, boron nitride, beryllia, zirconia, zircon, fosterite, steatite, spinel, mullite, or titania, or beads, glass fibers, and the like obtained by conglobating these powders. It is possible to use a single type or a combination of two or more types of these inorganic particles.

Of the inorganic particles mentioned above, molten silica is particularly suitable from the perspective of thermal expansion properties and crystalline silica and alumina are particularly suitable from the perspective of having high thermal conductivity. In addition, when producing silica particles as inorganic particles from an organic sol, because the particle size distribution thereof is narrow, it is possible to effectively distribute the particles in the resin composition. Moreover, the shape of the primary particles of the inorganic particles is not particularly important, but spherical particles are preferable from the perspective of being able to flow and penetrate into fine gaps.

In addition, from the perspective of the fluidity of the semiconductor package resin composition, the inorganic particles have a small average particle diameter and a narrow particle size distribution. Because the inorganic particles are prone to stacking when the semiconductor package resin composition is forced into a narrow gap, the inorganic particles used in the present invention have an average particle diameter of 10 μm or lower. In one embodiment, the average particle diameter of the inorganic particles is particularly 5 μm or lower, more particularly 3 μm or lower, and even more particularly 2 μm or lower. However, the lower limit of the average particle diameter of the inorganic particles is not particularly restricted, but from the perspective of fluidity, the average particle diameter is 0.05 μm or higher in the case of silica particles, and 0.1 μm or higher in the case of alumina particles. In one embodiment, the particle diameter of the inorganic particles in the semiconductor package resin composition is within the range "average particle diameter±(average particle diameter×0.3)" (for example, 1±0.3 μm). The average particle diameter and particle size distribution of the inorganic particles can be measured with an electron microscope or a laser scattering device. Moreover, the inorganic particles may be surface treated to an extent that does not impair the dispersibility of the particles in the resin composition.

Silica particles prepared by the sol-gel method and having a narrow particle size distribution are particularly suitable as the inorganic particles, and molten silica having an average particle diameter of 0.8 to 1.8 μm, prepared by the sol-gel method and having a narrow particle size distribution (average particle diameter±(average particle diameter×0.3)) are even more suitable. Such inorganic particles are commercially available as, for example, Silica KE-5150 and KE-S10 (produced by Nippon Shokubai Co., Ltd. using a sol-gel method), Silica HPS-1000 (produced by Toagosei Co., Ltd. by the sol-gel method), or Silica SS-07, SS-10 and SS-14 (produced by Tokuyama Corporation by the sol-gel method).

The semiconductor package resin composition of the present invention contains nano-particles surface treated with a silane that contains a photopolymerizable functional group. By exposing to light (for example, ultraviolet radiation and/or visible light), it is possible to adjust the fluidity of the resin composition by irradiating for a short period of time (between several seconds and several tens of seconds) and carrying out B-stage conversion (that is, carrying out sufficient curing for the composition to soften but not melt when heated).

In general, these nano-particles can be a powder such as silica (e.g., molten silica or crystalline silica), alumina, calcium silicate, calcium carbonate, potassium titanate, silicon carbide, silicon nitride, aluminum nitride, boron nitride, beryllia, zirconia, zircon, fosterite, steatite, spinel, mullite, or titania, or beads, glass fibers, and the like obtained by conglobating these powders. It is possible to use a single type or a combination of two or more types of these inorganic particles.

Of the nano-particles, silica particles are particularly suitable from the perspective of chemical stability and alumina is preferred from the perspective of thermal conductivity. In addition, when producing silica particles as nano-particles from an organic sol, because the particle size distribution thereof is narrow, it is possible to effectively distribute the particles in the resin composition. Moreover, the shape of the nano-particles is not particularly important, but spherical particles are particularly suitable from the perspective of being able to flow and penetrate into fine gaps.

Nano-particles suitable for use in the composition of the present invention have an average particle diameter in the range 1 nm to less than 1 μm. In order to improve the reactivity of a photopolymerizable functional group, the average particle diameter of the nano-particles is preferably small. Generally, the average particle diameter of the nano-particles can be 5 nm to 500 nm, particularly 10 nm to 300 nm, and more particularly 10 nm to 100 nm.

Functional groups capable of being polymerized by light include $CH_2=CH-C(=O)-O-$ groups, $CH_2=CCH_3-C(=O)-O-$ groups, glycidyl groups, vinyl groups, and the like.

The silane containing a photopolymerizable functional group can be 3-(trimethoxysilyl)propyl methacrylate, vinyltrimethoxysilane, vinyltriethoxysilane, p-styryltrimethoxysilane, or a (meth)acrylate silane such as 3-methacryloxypropyl trimethoxysilane, 3-methacryloxypropyl trimethoxysilane, methyldimethoxysilane, or 3-acryloxypropyl trimethoxysilane. These can bind to the surface of the nano-particles either by chemical bonding (covalent bonding or ionic bonding) or by strong physical binding.

Methods

The nano-particles surface treated with a silane that contains a photopolymerizable functional group can be prepared using, for example, the following methods.

A liquid is prepared by adding a silane that contains a photopolymerizable functional group to a solvent, and this liquid is then added to colloidal silica under stirring. After the stirring, a reaction mixture that contains surface-modified nano-particles is obtained by heating at an elevated temperature for 10 to 20 hours.

The reaction mixture is then allowed to cool to ambient temperature, and water is removed from the mixture by means of a rotary evaporator. Next, a solvent is added and any remaining water is removed by means of an evaporator (this step may be repeated several times.) A solvent is then added to the reaction mixture so as to adjust the solid content therein. The reaction mixture dispersion is then filtered through a 1.0 μm glass microfiber filter so as to remove sediments and obtain a dispersion that contains nano-particles surface treated with a silane that contains a photopolymerizable functional group in a solvent.

The quantities of the inorganic particles and nano-particles surface treated with a silane that contains a photopolymerizable functional group in the semiconductor package resin composition is 60 mass % or higher, relative to the overall quantity of the semiconductor package resin composition from the perspective of the coefficient of thermal expansion of the obtained cured object, and is 90 mass % or lower, relative to the overall quantity of the semiconductor package resin composition from the perspective of the viscosity of the resin composition. If the blending quantity of inorganic particles falls within this range, it is generally possible to obtain a cured product having a coefficient of thermal expansion of 35 ppm or lower and also possible for the semiconductor package resin composition of the present invention to be used as a semiconductor package resin composition.

The quantity of the nano-particles surface treated with a silane that contains a photopolymerizable functional group is not less than 0.1 mass % and not more than 10 mass %, relative to the total quantity of the nano-particles and inorganic particles. In cases where B-stage conversion is carried out, the quantity of nano-particles added is adjusted in order to obtain a desired viscosity (fluidity) of the resin composition. If the quantity of the nano-particles surface treated with a silane that contains a photopolymerizable functional group is too low, it is not possible to adjust the viscosity (fluidity) of the resin composition even when irradiated with light, and if this quantity is too high, complete curing occurs, shrinkage on curing occurs during thermal curing following irradiation with light, and cracks appear in the cured product.

It is particularly suitable to add a photopolymerization initiator to the semiconductor package resin composition of the present invention. Examples of photopolymerization initiators include, but are not limited to: benzoin, benzoin methyl ether, benzoin ethyl ether, benzoin n-propyl ether, benzoin n-butyl ether, benzil, benzophenone, p-methylbenzophenone, diacetyl, eosine, thionine, Michler's ketone, acetophenone, 2-chlorothioxanthone, anthraquinone, chloroanthraquinone, 2-methylanthraquinone, α-hydroxyisobutylphenone, p-isopropyl-α-hydroxyisobutylphenone, α,α'-dichloro-4-phenoxyacetophenone, 1-hydroxy-1-cyclohexylacetophenone, 2,2-dimethoxy-2-phenylacetophenone, methylbenzoin formate, 2-methyl-1-[4-(methylthio)phenyl]-2-morpholinopropene, dichlorothioxanthone, diisopropylthioxanthone, phenyldisulfide-2-nitrosofluorene, butyroin, anisoisoethyl ether, azobisisobutyronitrile, tetramethylthiuram disulfide, and the like. One or more types thereof may be used.

An organic titanium compound may be added to the semiconductor package resin composition. The organic titanium compound may have a hydrolyzable group or hydrophobic group in the compound. Such organic titanium compounds are generally known as titanium coupling agents. The organic titanium compound reacts with —OH groups on the surface of the inorganic particles and, for example, forms covalent bonds with the titanium by eliminating an alcohol by hydrolysis. Without being bound by theory, it is thought that this makes the surface of the inorganic particles organic, which results in good dispersibility of the inorganic particles in the epoxy resin.

The hydrolyzable group in the organic compound can be, for example, $R^1O-$, $-O-CH_2-CH_2-O-$ or $-O-CH_2-C(=O)-O-$ and the like. Here, $R^1$ can be a substituted or unsubstituted, straight chain or branched chain alkyl group, alkenyl group, aryl group, or aralkyl group. Because $R^1$ is eliminated after the reaction with the inorganic particles (for example, eliminated by forming an alcohol), it is preferable for R1 to be a group having a somewhat lower boiling point following elimination. Therefore, a particularly suitable $R^1$ is a group having few carbon atoms, and particularly a substituted or unsubstituted, straight chain or branched chain alkyl group having 1 to 10 carbon atoms (and more particularly 1 to 8 carbon atoms).

In addition, the hydrophobic group in the organic titanium compound can be $-O-C(=O)-R^2$, $-O-S(=O)_2-Ph-R^2$, $-O-P(=O)(-OH)-O-P(=O)-(OR^2)_2$, $-O-P(=O)-(OR^2)_2$, $HO-P-(OR^2)_2$, $-O-(CH_2)m-NH-(CH_2)n-NH_2$, and the like. Here, Ph denotes a phenyl group, m and n are each an integer between 1 and 10, and $R^2$ can be a substituted or unsubstituted, straight chain or branched chain alkyl group, alkenyl group, aryl group, or aralkyl group. In order to improve the efficiency with which the surface of the inorganic particles is covered, $R^2$ is particularly a group having many carbon atoms, and more particularly a substituted or unsubstituted, straight chain or branched chain alkyl group having 8 to 30 carbon atoms.

Of these, $-O-C(=O)-R^2$, $HO-P-(OR^2)_2$, and $-O-(CH_2)m-NH-(CH_2)n-NH_2$ are particularly suitable hydrophobic groups from the perspectives of reactivity with the inorganic particles in the semiconductor package resin composition and reduced viscosity of the semiconductor package resin composition. From the perspective of fluidity, $-O-C(=O)-R^2$ or $HO-P-(OR^2)_2$ is more suitable, and from the perspective of the stability of the titanium coupling agent, $-O-C(=O)-R^2$ is more suitable. Here, $R^2$ is a substituted or unsubstituted, straight chain or branched chain alkyl group having 8 to 30 carbon atoms, and preferably 10 to 30 carbon atoms.

Specifically, the titanium coupling agent can be, for example, a tetraalkoxy titanium (such as tetraethoxy titanium, tetraisopropoxy titanium, or tetrabutoxy titanium), tetra(ethylene glycol) titanate, di-n-butylbis(triethanolamine) titanate, di-isopropoxy bis(acetyl acetonate)titanium, isopropoxy titanium octanoate, isopropyl titanium trimethacrylate, isopropyl titanium triacrylate, isopropyl triisostearoyl titanate, isopropyl tridecylbenzenesulfonyl titanate, isopropyl tri(butyl, methylpyrophosphate) titanate, tetraisopropyl di(dilauryl phosphite) titanate, dimethacryloxyacetate titanate, diacryloxyacetate titanate, di(dioctyl phosphite)ethylene titanate, isopropoxy titanium tri(dioctyl phosphate), isopropyl tris(dioctyl pyrophosphate) titanate, tetraisopropyl bis(dioctyl phosphite) titanate, tetraoctyl bis(di-tridecyl phosphite) titanate, tetra(2,2-diallyloxymethyl-1-butyl)bis(di-tridecyl)phosphite titanate, bis(dioctyl pyrophosphate) oxyacetate titanate, tris(dioctyl pyrophosphate)ethylene titanate, isopropyl tri-n-dodecylbenzenesulfonyl titanate, isopropyl trioctanoyl titanate, isopropyl dimethacryloyl isostearoyl titanate, isopropyl isostearoyl diacrylic titanate, isopropyl tri(dioctyl phosphate) titanate, isopropyl tricumylphenyl titanate, isopropyl tri(N-aminoethyl-aminoethyl) titanate, and the like.

KRTTS (isopropyltriisostearoyl titanate $(CH_3)_2CHOTi[OCO(CH_2)_{14}CH(CH_3)_2]_3$), KR 46B (tetraoctylbis(di-tridecylphosphite) titanate), KR 55 (tetra(2,2-diallyloxymethyl-1-butyl)bis(di-tridecyl)phosphite titanate), KR 41B (tetraisopropylbis(dioctylphosphite) titanate), KR 38S (isopropyltris(dioctylpyrophosphate) titanate), KR 138S (bis (dioctylpyrophosphate)oxyacetate titanate), KR 238S (tris (dioctylpyrophosphate)ethylene titanate), 338X (isopropyldioctylpyrophosphate titanate), KR 44 (isopropyl-tri(N-aminoethylaminoethyl) titanate), KR 9SA (isopropyl-tris(dodecylbenzylphenyl) titanate), and the like of the Plenact® series, which is sold by Ajinomoto Fine-Techno Co., Inc., can be used. Plenact KR TTS, KR 46B and KR 9SA are suitable, and Plenact KR TTS and KR 46B are more suitable.

From the perspective of reducing the viscosity of the semiconductor package resin composition, the blending quantity of the organic titanium compound is 1 mass % or higher, particularly 2 mass % or higher, and more particularly 2.5 mass % or higher, relative to the total quantity of the semiconductor package resin composition. However, from the perspectives of reduced glass transition temperature and modulus of elasticity of the obtained cured product, the blending quantity of the organic titanium compound is 5 mass % or lower, particularly 4 mass % or lower, and more particularly 3 mass % or lower, relative to the total quantity of the semiconductor package resin composition.

Among organic phosphoric acid compounds, phosphoric acid esters capable of being used in the semiconductor package resin composition of the present invention include, but are not limited to, esters obtained by subjecting phosphoric acid and an alcohol to dehydrocondensation. By further adding a phosphoric acid ester to the above-mentioned organic titanium compound, the phosphoric acid ester forms weak bonds, such as coordinate bonds, with the titanium. As a result, the organic layer on the surface of the inorganic particles, which is rendered organic by the organic titanium compound, increases in depth.

Specifically, the phosphoric acid ester has a structure in which all or some of the three hydrogen atoms in the phosphoric acid (O—P(OH)$_3$) are replaced by organic groups. Compounds in which one, two, and three hydrogen atoms are replaced are known as a phosphoric acid monoester (P(OZ)$_3$), a phosphoric acid diester (HOP(OZ)$_2$), and a phosphoric acid triester ((HO)$_2$POZ), respectively. Here, Z denotes a substituted or unsubstituted alkyl group, phenyl group, polyester, or polycaprolactone having 10 to 50 carbon atoms, and the like. From the perspective of increasing the thickness of the organic layer formed on the surface of the inorganic particles, Z particularly has a high molecular weight. Particularly, a weight average molecular weight of 200 to 20,000 and more particularly, a weight average molecular weight of 300 to 10,000.

For example, dimethyl phosphate, diethyl phosphate, dipropyl phosphate, monobutyl phosphate, dibutyl phosphate, mono-2-ethylhexyl phosphate, di-2-ethylhexyl phosphate, monophenyl phosphate, mono-2-ethylhexyl phosphite, dioctyl phosphate, diphenyl phosphate, and the like can be used as the compound mentioned above. A suitable commercially available product includes, but is not limited to, Disperbyk 111 produced by BYK Chemicals Japan.

Of the phosphoric acid esters mentioned above, phosphoric acid diesters are particularly suitable, and phosphoric acid diesters in which Z is a polycaprolactone are more particularly suitable, from the perspective of dispersion of the inorganic particles.

From the perspective of reducing the viscosity of the semiconductor package resin composition, the blending quantity of the phosphoric acid ester is at least 0.5 mass %, particularly at least 1 mass %, and more particularly at least 1.2 mass %, relative to the total quantity of the semiconductor package resin composition. However, from the perspective of the possibility of causing a reduction in the electrical properties (insulating properties) of the obtained cured product, the blending quantity of the phosphoric acid ester is 3 mass % or less, particularly 2 mass % or less, and more particularly 1.8 mass % or less, relative to the total quantity of the semiconductor package resin composition.

As mentioned above, by combining an organic titanium compound with a phosphoric acid ester, it is possible to improve the dispersibility of the inorganic particles in the epoxy resin and to improve the fluidity of the obtained semiconductor package resin composition. In particular, a combination of an organic titanium compound having a chemical structure represented by $R^3OTi(OCOR^4H)_3$ or $(R^3O)_4Ti[HOP(OR^4)_2]$ (here, $R^3$ denotes a straight chain or branched chain alkyl group having 3 to 8 carbon atoms and $R^4$ denotes a straight chain or branched chain alkyl group having 10 to 20 carbon atoms) and a phosphoric acid diester having a weight average molecular weight of 200 to 20,000 and having a chemical structure represented by $HOP(OZ)_2$ (here, Z denotes a substituted or unsubstituted alkyl group, phenyl group, polyester or polycaprolactone having 10 to 50 carbon atoms) is particularly suitable.

In addition to the components mentioned above, the semiconductor package resin composition of the present invention may also contain a reaction accelerator. Here, the reaction accelerator used to accelerate the reaction between the epoxy resin and the curing agent can be a reaction accelerator known to those of skill in the art, such as a cycloamidine compound, a tertiary amine, a quaternary ammonium salt, an imidazole, an organic metal compound that acts as a Lewis acid, a phosphorus-based compound such as an organic phosphine such as triphenyl phosphine, or a derivative or tetraphenyl boron salt thereof. A single reaction accelerator or a combination of two or more types thereof can be used. Moreover, the blending quantity of the reaction accelerator is not particularly limited as long as a reaction acceleration effect is achieved.

In addition, it is possible to blend an ion trapping agent in the semiconductor package resin composition of the present invention in order to improve the moisture resistance and high temperature exposure characteristics of a semiconductor device. The ion trapping agent is not particularly limited, and it is possible to use any ion trapping agent known to one of skill in the art. Particularly, it is possible to use hydrotalcite or a water-containing oxide of an element such as magnesium, aluminum, titanium, zirconium, or bismuth.

Furthermore, stress relaxing agents such as silicone rubber powders, dyes, colorants such as carbon black, leveling agents, anti-foaming agents, and other inorganic fillers (for example, inorganic fillers having a flame retardant effect, such as aluminum hydroxide, magnesium hydroxide, zinc silicate, or zinc molybdate) and the like can be blended in the semiconductor package resin composition of the present invention at levels that do not impair the object of the present invention. In addition, red phosphorus, phosphoric acid esters, melamine, melamine derivatives, compounds having a triazine ring, nitrogen-containing compounds such as cyanuric acid derivatives or isocyanuric acid derivatives, phosphorus- and nitrogen-containing compounds such as cyclophosphazene, metal compounds such as zinc oxide, iron oxide, molybdenum oxide, and ferrocene, antimony oxides such as antimony trioxide, antimony tetraoxide, and antimony pentoxide, and flame retardants such as brominated epoxy resins and the like can also be blended in the semiconductor package resin composition of the present invention.

As long as the components mentioned above can be blended and dispersed uniformly, the semiconductor package resin composition of the present invention may be produced using any type of production method. A common production method is to blend the specified blending quantities of the raw materials either together or separately, stir, dissolve, blend and disperse these components in a mixing roller, extruder, planetary mixer, and the like while, if necessary, heating and cooling, and then cooling and, if necessary, defoaming and crushing. Moreover, it is also possible firstly to prepare a mixture of all the components except the inorganic particles and then to add the inorganic particles to this mixture to obtain the semiconductor package resin composition. In addition, it is also possible to form the semiconductor package resin composition into tablets having dimensions and weights appropriate to the molding conditions if required.

The semiconductor package resin composition of the present invention can be sufficiently cured by photopolymerization so as to effect B-stage conversion (that is, carrying out sufficient curing for the composition to soften but not melt when heated).

In one embodiment, a final cured product of the semiconductor package resin composition of the present invention has a coefficient of thermal expansion of 10 to 35 ppm. Because silicon has a low coefficient of thermal expansion, it is preferable for a material used to seal silicon to also have a low coefficient of thermal expansion when sealing a semiconductor. If the coefficient of thermal expansion exceeds 35 ppm, there are concerns over cracks occurring due to thermal stress. Moreover, it is possible to use a TMA (Thermal Mechanical Analyzer) to measure the coefficient of thermal expansion. Specifically, it is possible to measure the coefficient of thermal expansion with a TMA 8310 thermomechanical analysis apparatus manufactured by Rigaku Corporation. A sample (size: 4×5×10 mm$^3$) is heated at a rate of 20° C./minute in a nitrogen stream, a load of 10 mN is applied, and measurements are carried out in compression mode.

In one embodiment, a final cured product of the semiconductor package resin composition of the present invention has a glass transition temperature (Tg) of 60 to 120° C. and a modulus of elasticity (dynamic storage modulus; E') of 5 to 40 GPa. The glass transition temperature and modulus of elasticity can be measured using a DMA (dynamic mechanical analysis) apparatus. The method of measurement involves using a solid analyzer (RSA-III) manufactured by Rheometric Scientific in a three point curve mode (strain: 0.05%, frequency: 1 Hz) and a sample (size: 2×10×35 mm$^3$) heated at a rate of 3° C./minute.

Specifically, it is possible to use the three point curve method to measure the modulus of elasticity (dynamic storage modulus) by placing the above-mentioned cuboid sample (size: 2×10×35 mm$^3$) on two knife edges (separated by 25 mm) and measuring the load use to push down on the central part of the sample, thereby deforming the sample. In this case, the strain is applied as a sine wave having a maximum value of 0.05%, and the load is also measured as a sine wave (the sine wave frequency is 1 Hz).

Method for Producing Semiconductor Package

In an embodiment, the present invention provides a method for producing a semiconductor package, which includes (1) a step of providing an electronic component and/or a substrate, (2) a step of disposing a first semiconductor package resin composition, which contains an epoxy resin, a curing agent, inorganic particles, and nano-particles surface treated with a silane that contains a photocrosslinkable group, on the electronic component and/or substrate, (3) a B-stage conversion step in which all or part of the first semiconductor package resin composition is irradiated with light, and (4) a step curing of the first semiconductor package resin composition by heating. The semiconductor package production method of the present invention may be used to connect an electronic component to another electronic component or an electronic component to a substrate.

Figure 3:
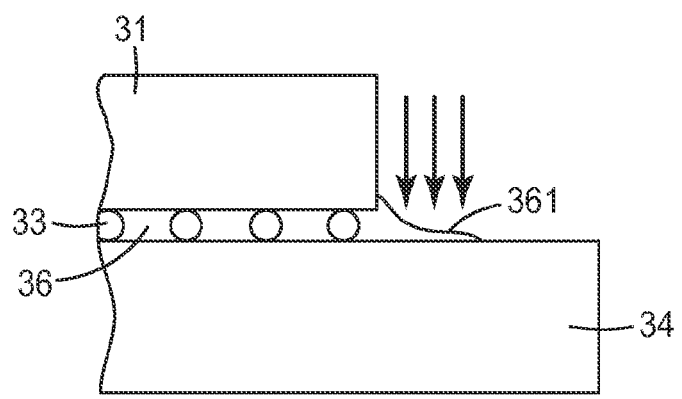
FIG. 3 is a cross-sectional view of a semiconductor package produced using a semiconductor package production method according to an embodiment of the present invention.

In one embodiment of the present invention, a semiconductor package in which an electronic component (31) and a substrate (34) are connected is produced, as shown in FIG. 3. After preparing the electronic component (31) and the substrate (34), a first semiconductor package resin composition (36) is disposed on a surface of the electronic component (31) and/or the substrate (34). Methods for disposing the resin composition include low pressure transfer molding, injection molding, compression molding and the like. In addition, it is possible to use a dispensing method, a casting method, a printing method and the like. From the perspective of filling properties, it is particularly suitable to use a molding method that allows for molding under low pressure conditions.

When the first semiconductor package resin composition (36) is disposed into the space between the substrate (34) and the electronic component (31) and in spaces between adjacent bumps (33), the viscosity of the resin composition (36) being filled is low, allowing the resin composition (36) to flow outside the space between the substrate (34) and the electronic component (31). However, because unnecessary outflow of the resin composition (36) can have an adverse effect on other elements on the substrate, the outflow (361) is subjected to B-stage conversion through irradiation with light. Because the light does not reach the resin composition positioned between the substrate (34) and the electronic component (31), B-stage conversion does not occur in this space. In addition, the outflow (361) that has been subjected to B-stage conversion acts as a dam and prevents further outflow.

The light used for the irradiation can be light of any wavelength region able to bring about photopolymerization of the resin composition, such as ultraviolet radiation or visible light. The light source can be a low pressure, medium pressure, or high pressure mercury vapor lamp, a laser, a xenon flash lamp, or the like.

Final curing is carried out by heating the first semiconductor package resin composition (36) under pre-determined conditions (i.e., time and temperature). The outflow (361) is also cured.

The final curing is generally carried out by heating at a temperature of not lower than 120° C. and not higher than 200° C. for a period of between 10 minutes and 3 hours. During this step, the glycidyl groups in the epoxy resin react with the curing agent. This type of cured product has a three-dimensionally crosslinked chemical structure.

Figure 4A:
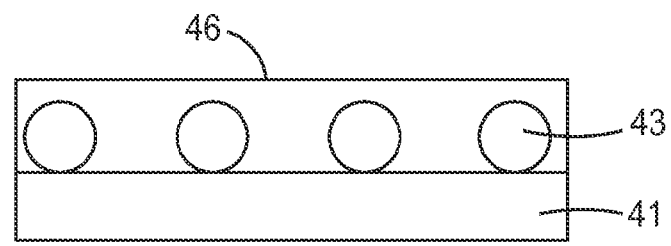
FIG. 4a is a schematic cross-sectional view of a step of a semiconductor package production method according to an embodiment of the present invention in which a semiconductor package resin composition is disposed on an electronic component.

As shown in FIG. 4a, the step of disposing the first semiconductor package resin composition (46) on the electronic component (41) or the substrate can be carried out by disposing the first semiconductor package resin composition (46) on the surface of the electronic component (41) provided with bumps (43) so as to fill the spaces between the bumps (43) on the electronic component (41).

Figure 5A:
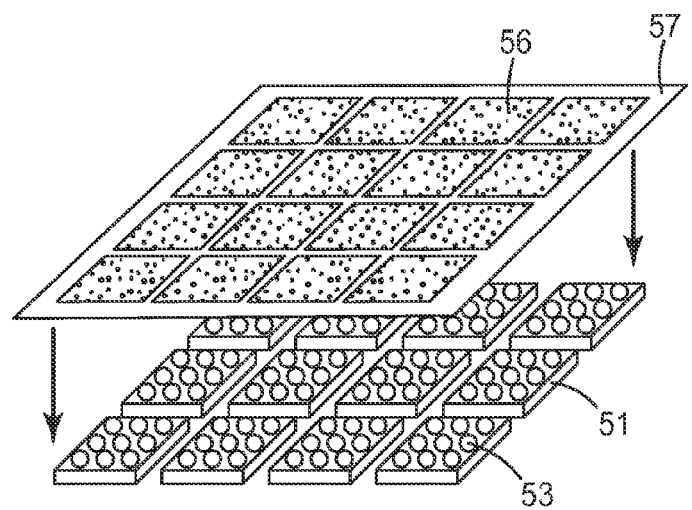
FIG. 5a is a schematic view of a step of a semiconductor package production method according to an embodiment of the present invention in which a support body on which a semiconductor package resin composition is printed is laminated on a wafer provided with bumps.
Figure 5B:
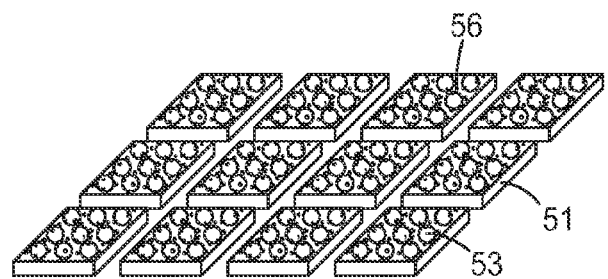
FIG. 5b is a schematic view of a wafer which is provided with bumps and on which a first semiconductor package resin composition is disposed according to an embodiment of the present invention.

In addition, it is possible to laminate a support body (57), for example, a release film or release paper, on which a first semiconductor package resin composition (56) is printed on the surface of individually divided electronic components (51) provided with bumps (53), as shown in FIG. 5a. It is also possible to transfer a first semiconductor package resin composition (56) to the surface of an electronic component (51) provided with bumps (53), as shown in FIG. 5b. In this method for disposing, the electronic component (51) is laminated with a transparent support body (57), the support body side is irradiated with light so as to subject the resin composition (56) to B-stage conversion and eliminate fluidity, and the support body (57) can then be peeled from the electronic component (51). By using this type of method for disposing, a resin composition can be easily disposed on individually divided electronic components.

Figure 5C:
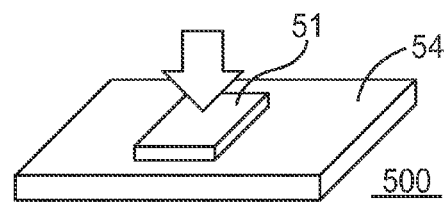
FIG. 5c is a schematic view of a step of a semiconductor package production method according to an embodiment of the present invention in which a wafer is contact bonded to a substrate following B-stage conversion of a semiconductor package resin composition.

The electronic component (51) is heated using an apparatus such as an oven so as to further facilitate curing of the first semiconductor package resin composition (56), but the reaction is stopped before final curing (gelation) occurs. In this way, it is possible to produce a semiconductor package (500) by contact bonding an electronic component (51), on which a resin composition (56) formed on the surface of the electronic component provided with bumps (53) has been cured, to a substrate (54), as shown in FIG. 5c.

Figure 6:
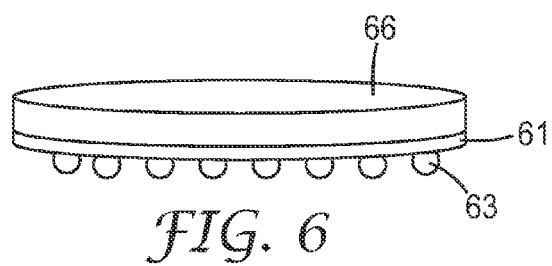
FIG. 6 is a view of an electronic component in which a semiconductor package resin composition is disposed on a surface not provided with bumps according to an embodiment of the present invention.

Furthermore, the step of disposing a first semiconductor package resin composition on an electronic component or a substrate can be carried out by adding a first semiconductor package resin composition (66) dropwise to a surface of an electronic component (61) not provided with bumps (63) and then spin coating, as shown in FIG. 6. By adding a ceramic filler (silica, alumina, and the like) to this semiconductor package resin composition, it is possible to obtain a heat conductive resin composition and dissipate heat generated by the electronic component to the outside.

Figure 2:
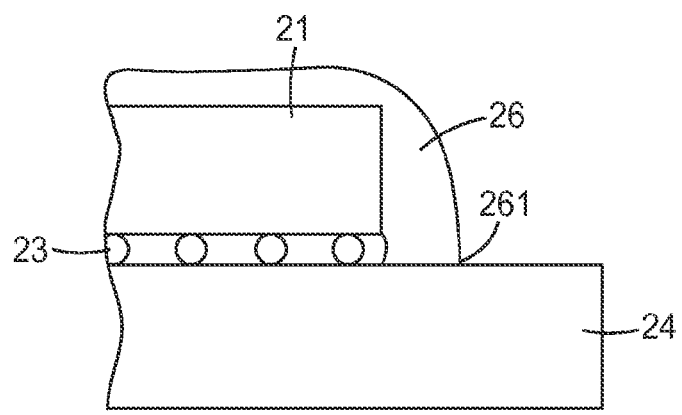
FIG. 2 is a cross-sectional view of a prior art semiconductor package with an overmolding agent.

In one embodiment, the step of subjecting the first semiconductor package resin composition disposed on the electronic component and/or the substrate to irradiation with light can be the above-mentioned step of irradiating the outflow (361) with light, as shown in FIG. 3. In another embodiment, subjecting the first semiconductor package resin to irradiation with light can also be carried out by disposing the resin composition (24) on the electronic component (21) and the substrate (26) as an overcoating agent, as shown in FIG. 2, and then irradiating the whole of the resin composition (26) with light.

Figure 4B:
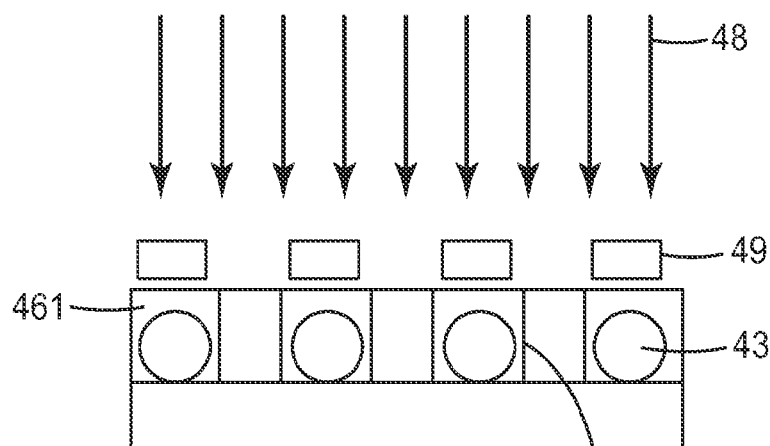
FIG. 4b is a schematic cross-sectional view of a step of a semiconductor package production method according to an embodiment of the present invention in which a part of a semiconductor package resin composition is subjected to irradiation with light.
Figure 4C:
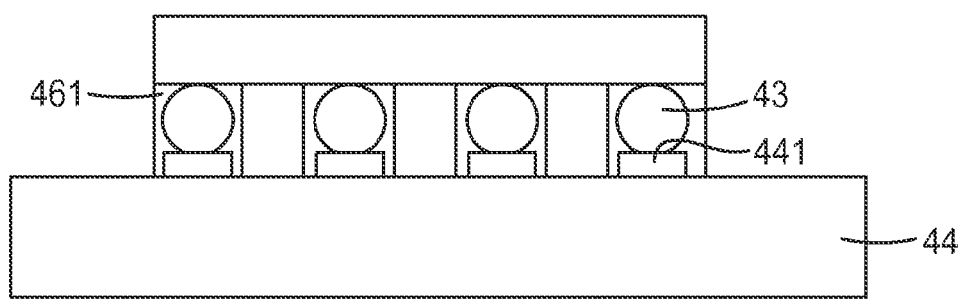
FIG. 4c is a schematic cross-sectional view of a step of a semiconductor package production method according to an embodiment of the present invention in which an electronic component is contact bonded to a substrate.

In addition, it is possible to dispose the first semiconductor package resin composition (46) on the electronic component (41), as shown in FIG. 4a, place a mask (49) in such a way that the bumps (43) are not exposed to light, and then irradiate the first semiconductor package resin composition (46) with light (48), as shown in FIG. 4b. Because the resin composition at the masked bumps (43) is not subjected to B-stage conversion and remains fluid, good electrical contact is obtained between the electrodes (441) and the bumps (43) on the surface of the substrate (44) when disposed on the substrate (44), as shown in FIG. 4c.

Figure 7A:
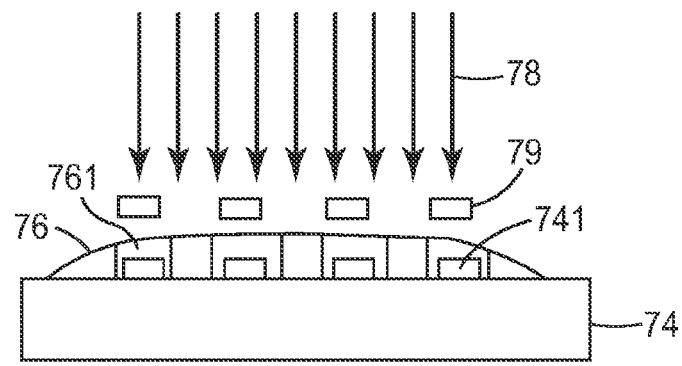
FIG. 7a is a schematic cross-sectional view of a step of a semiconductor package production method according to an embodiment of the present invention in which a semiconductor package resin composition is subjected to B-stage conversion by irradiation with light.
Figure 7B:
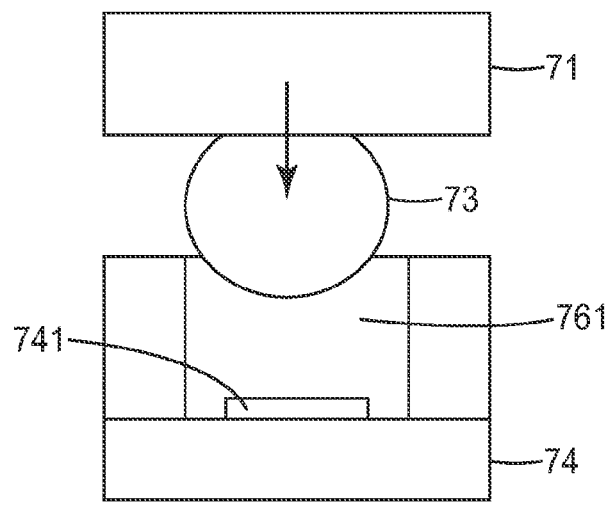
FIG. 7b is a schematic cross-sectional view of a step of a semiconductor package production method according to an embodiment of the present invention in which an electronic component is contact bonded to a substrate.
Figure 7C:
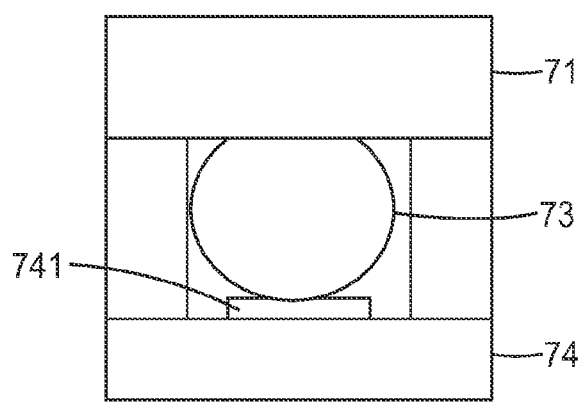
FIG. 7c is a cross-sectional view of a semiconductor package produced using a semiconductor package production method according to an embodiment of the present invention.

Furthermore, as shown in FIG. 7a, it is possible to dispose a first semiconductor package resin composition (76) on the substrate (74), position a mask (79) in such a way that the electrodes (741) on the surface of the substrate (74) are not exposed to light, and then irradiate the first semiconductor package resin composition (76) with light (78). Because the resin composition (761) at the masked electrodes (741) is not subjected to B-stage conversion and remains fluid, good electrical contact is obtained between the electrodes (741) and the bumps (73) on the electronic component (71) when disposed on the electronic component (71), as shown in FIG. 7b and FIG. 7c.

Figure 8A:
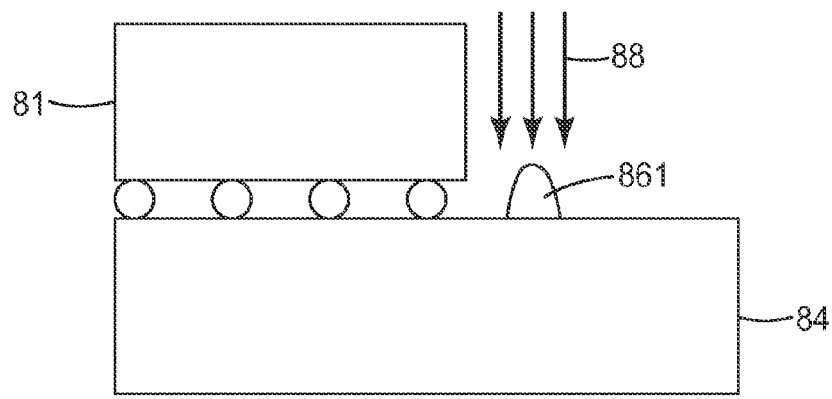
FIG. 8a is a schematic cross-sectional view of a step of a semiconductor package production method according to an embodiment of the present invention in which a first semiconductor package resin composition is disposed on the surface of a substrate.
Figure 8B:
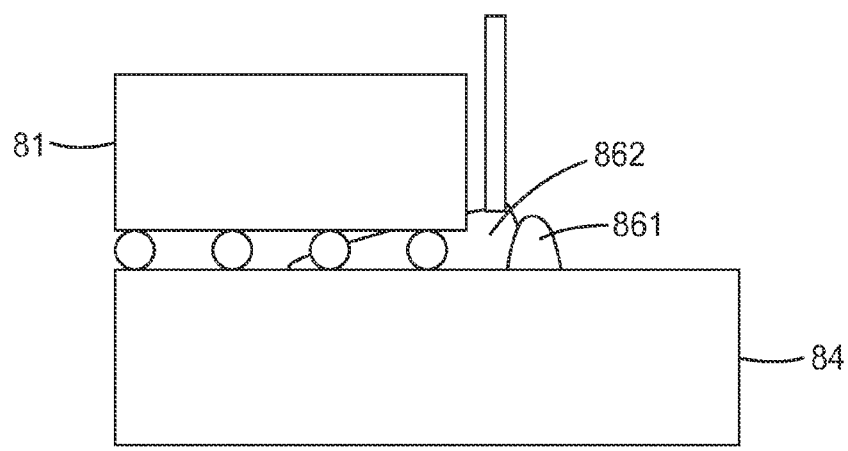
FIG. 8b is a schematic cross-sectional view of a step of a semiconductor package production method according to an embodiment of the present invention in which a second semiconductor package resin composition is disposed on the surface of a substrate.
Figure 8C:
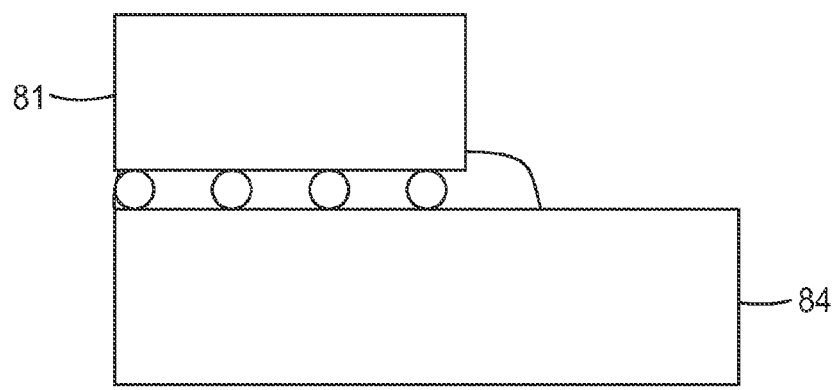
FIG. 8c is a cross-sectional view of a semiconductor package produced using a semiconductor package production method according to an embodiment of the present invention.

In another embodiment of the present invention, a semiconductor package in which an electronic component (81) and a substrate (84) are connected is produced, as shown in FIG. 8c. In this semiconductor package production method, an electrical component (81) and a substrate (84) are prepared as shown in FIG. 8a, and a first semiconductor package resin composition (861) is disposed on the surface of the substrate (84). This method for disposing the resin composition (861) can be any of the various methods mentioned above, but the resin composition (861) is disposed in such a way as to act as a dam that surrounds the electronic component (81).

Next, the resin composition (861) is subjected to B-stage conversion by being irradiated with light (88) and a second semiconductor package resin composition (862) is then disposed on the surface of the substrate (84), as shown in FIG. 8b. The second semiconductor package resin composition (862) also contains an epoxy resin, a curing agent, inorganic particles, and nano-particles surface treated with a silane that contains a photocrosslinkable group. In order to obtain approximately the same module, coefficient of thermal expansion, and glass transition point (Tg) following final curing as the first semiconductor package resin composition, in one embodiment the second semiconductor package resin composition (862) has exactly the same composition as the first semiconductor package resin composition (861).

The first semiconductor package resin composition (861) and the second semiconductor package resin composition (862) are then heated simultaneously so as to effect final curing, thereby producing the semiconductor package shown in FIG. 8c. The first semiconductor package resin composition (861) and the second semiconductor package resin composition (862) may be heated separately, but are preferably heated simultaneously in order to achieve almost identical modules, coefficients of thermal expansion, and glass transition points (Tg) following final curing.

Figure 9:
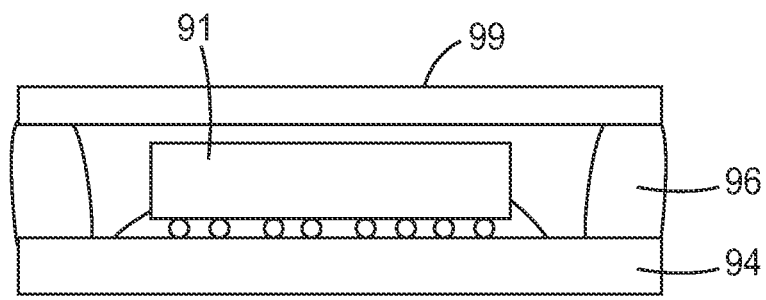
FIG. 9 is a cross-sectional view of a semiconductor package produced using a semiconductor package production method according to an embodiment of the present invention.

In another embodiment of the present invention, a semiconductor package obtained by disposing a lid (99) on a semiconductor package resin composition (96) disposed on a substrate (94) is produced, as shown in FIG. 9. The semiconductor package resin composition (96) is dispensed in such a way as to surround an electronic component (91), such as a semiconductor chip, mounted on the substrate (94), subjected to B-stage conversion by irradiating with ultraviolet radiation, covered with the lid (99), subjected to heat and pressure so as to bond the resin composition (96) to the lid (99), and cured. The dispensing and ultraviolet radiation irradiation step may be carried out several times, and the height of the resin walls may also be increased to a sufficient height.

EXAMPLES

The present invention is more particularly described in the following examples that are intended as illustrations only, since numerous modifications and variations within the scope of the present invention will be apparent to those skilled in the art. Unless otherwise noted, all parts, percentages, and ratios reported in the following example are on a weight basis.

The components used in the production of the semiconductor package resin composition are shown in Table 1.

TABLE 1

| Code | Compound |
| --- | --- |
| ZX1059 | Bisphenol AF type epoxy resin (product name ZX1059, produced by Nippon Steel Chemical Co., Ltd.) |
| MH700 | Mixture of hexahydrophthalic acid anhydride and methylhexahydrophthalic acid anhydride (product name Rikacid MH700, produced by New Japan Chemical Co., Ltd.) |
| TTS | Isopropyl triisostearoyl titanate (product name Plenact, produced by Ajinomoto Fine-Techno Co., Inc.) |
| JP-518-0 | Oleyl acid phosphate (Organophosphorus compound, produced by Johoku Chemical Co., Ltd.) |
| TPPK | Tetraphenylphosphonium tetraphenylborate (phosphonium-based curing accelerator, produced by Hokko Chemical Industry Co., Ltd.) |
| KE-S150 | SiO2 filler (average particle diameter 1.35 μm) (product name Seahostar, produced by Nippon Shokubai Co., Ltd.) |

TABLE 1-continued

| Code | Compound |
|---|---|
| KE-S10 | SiO2 filler (average particle diameter 0.10 μm) (product name Seahostar, produced by Nippon Shokubai Co., Ltd.) |
| Nano Epoxy 20101104 | Epoxy resin dispersion of surface treated nano-particles (nano-particle content 33%) |
| M5300 | ω-Carboxy-polycaplolactone monoacrylate (product name Aronix, produced by Toagosei Co., Ltd.) |
| D1173 | 2-hydroxy-2-methyl-phenyl-propane-1-one (ultraviolet radiation-curable catalyst, produced by Ciba Speciality Chemicals) |

To produce Nano Epoxy 20101104, a liquid was first prepared by adding 25.73 g of 3-(trimethoxysilyl)propyl methacrylate (product name A174, 98% 3-(trimethoxysilyl)propyl methacrylate, produced by Aldrich) and 0.5 g of a 5 mass % aqueous solution of 4-hydroxy-2,2,6,6-tetramethyl piperidine 1-oxyl free radicals (produced by Tokyo Chemical Industry Co., Ltd.) to 450 g of 1-methoxy-2-propanol. The liquid was then added to 400 g of colloidal silica (product name O-40, produced by Nissan Chemical Industries, Ltd., solid content 40%) while stirring. After stirring for 10 minutes, a reaction mixture containing surface-modified nano-particles was obtained by heating the liquid for 16 hours at 80° C.

The reaction mixture was cooled to ambient temperature and the water in the mixture was then removed using a rotary evaporator. 200 g of 1-methoxy-2-propanol was then added to the liquid and any remaining water was removed using an evaporator. A silica nano-dispersion was obtained by repeating this step two more times. The solid content was adjusted to approximately 45 wt. % by adding 1-methoxy-2-propanol to this silica nano-dispersion. In order to remove sediments from the dispersion, the dispersion was passed through a 1.0 μm glass microfiber filter so as to obtain a dispersion that contained 45 wt. % of A-174/silica nano-particles in 1-methoxy-2-propanol.

A mixture of a bisphenol A type epoxy resin and a bisphenol F type epoxy resin (product name ZX1059, produced by Nippon Steel Chemical Co., Ltd.) was added to the nano-particle dispersion (solid content 45%) and stirred until homogeneous. The 1-methoxy-2-propanol solvent was then completely removed using a rotary evaporator so as to obtain Nano Epoxy 20101104 (nano-particle content 33%), an epoxy resin dispersion of nano-particles surface treated with a silane containing a photopolymerizable functional group.

Example 1

Comparative Example A, and Reference Example B

Using the blending quantities shown in Table 2, the components were added to a DAC Mixer (model name AR-250, produced by Thinky) and blended by stirring at 3000 rpm at room temperature, thereby obtaining the semiconductor package resin compositions of Example 1, Comparative Example A, and Reference Example B.

TABLE 2

|  | Ex. 1 (Parts by weight) | Comparative Ex. A (Parts by weight) | Reference Ex. B (Parts by weight) |
|---|---|---|---|
| ZX1059 | 13.2 | 40 | 0 |
| MH700 | 33.6 | 33.6 | 33.6 |
| TTS | 6 | 6 | 6 |
| JP-518-0 | 3 | 3 | 3 |
| TPPK | 1 | 1 | 1 |
| KE-S10 | 25 | 25 | 25 |
| KE-S150 | 120 | 165 | 120 |
| 3M Nanoepoxy 20101124 | 40 | — | 60 |
| M5300 | — | 23 | — |
| D1173 | 1 | 1 | 1 |

Evaluation of Semiconductor Package Resin Compositions

Fluidity

Figure 10:
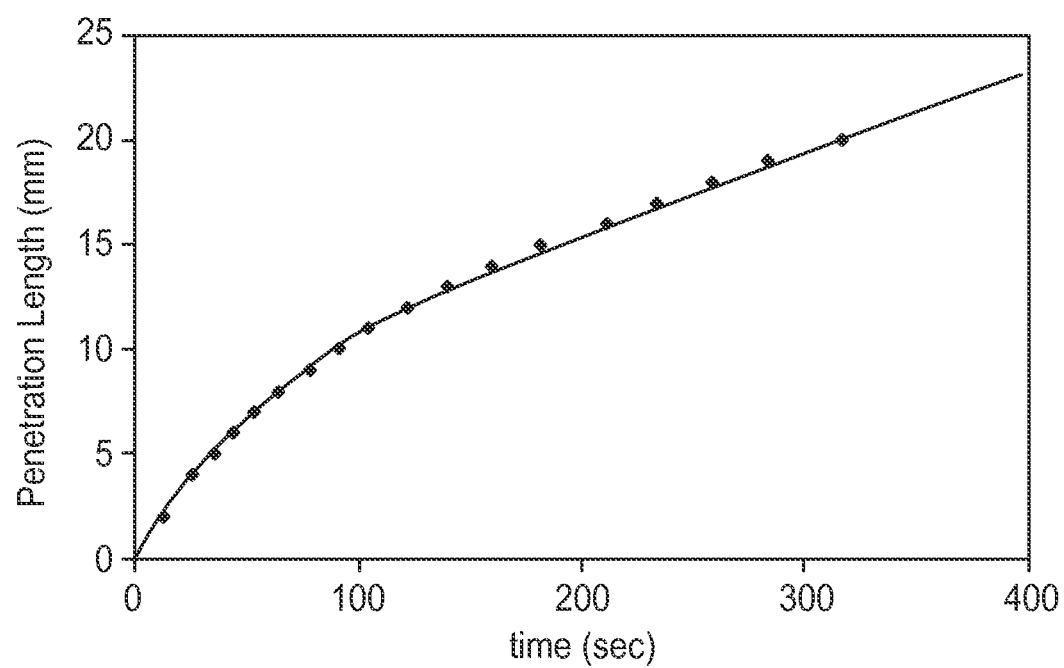
FIG. 10 is a graph showing the fluidity of a semiconductor package resin composition according to an embodiment of the present invention.

The time and length of penetration of the semiconductor package resin composition of Example 1 between two glass plates (upper plate 30×30 mm, lower plate 40×40 mm) separated by a gap of 40 μm were measured. The glass plates were placed on a hot plate at a temperature of 100° C. and the semiconductor package resin composition was applied to the edge of the upper plate. The length of penetration of the semiconductor package resin composition from the edge of the upper plate and the time required for this penetration were measured and recorded. The results are shown in FIG. 10.

Photocuring

Figure 11:
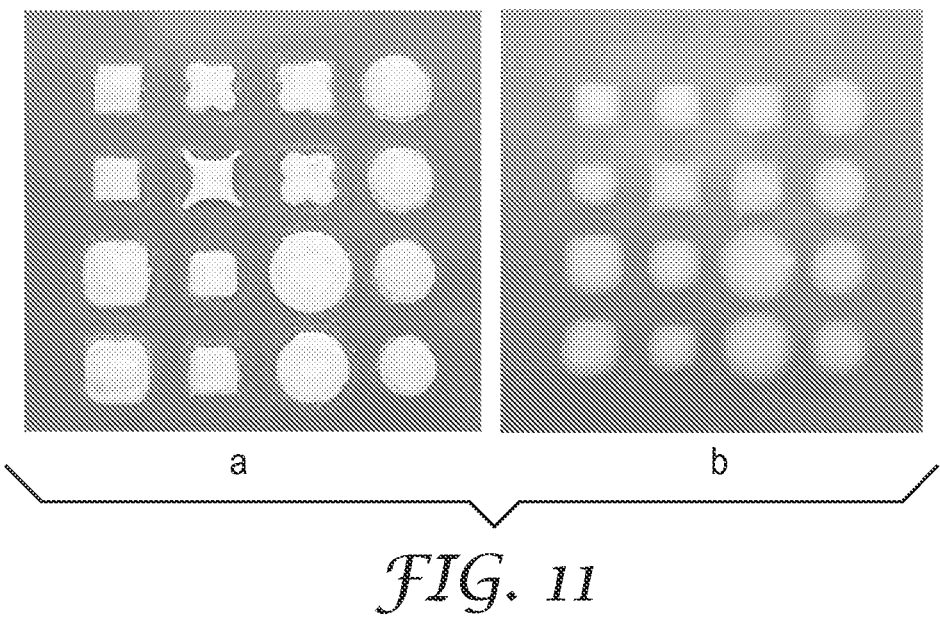
FIG. 11 is a graph showing the photocurability of a semiconductor package resin composition according to an embodiment of the present invention.

The semiconductor package resin composition of Example 1 was printed on a 50×50 mm printed circuit board (manufactured by Arm Electronics Co., Ltd.) using a metal mask. When carrying out the printing, the metal mask was placed on the circuit board and the composition was printed only on those parts of the circuit board not covered by the mask. Two of these printed samples were prepared, one of which was irradiated with ultraviolet radiation at 500 Mj/cm$^2$ using a low pressure mercury vapor lamp (sample a). Both samples were then heated at 120° C. for 60 minutes in an oven and then removed from the oven and photographed. The results are shown in FIG. 11. As can be seen in FIG. 11, the resin composition that had been irradiated with ultraviolet radiation exhibited reduced fluidity at high temperatures and maintained the original shape during printing.

The semiconductor package resin compositions of Example 1 and Reference Example B were each applied to a glass plate (30×30 mm) and a glass plate (6×6 mm) was placed thereupon from above. The glass plates were then irradiated with ultraviolet radiation at 500 Mj/cm$^2$ using a low pressure mercury vapor lamp and then heated for 30 seconds on a hot plate at 250° C. Following curing, no external cracks were seen in the sample of Example 1, but because the sample of Reference Example B was excessively cured by being subjected to irradiation with ultraviolet radiation, cracks occurred in the resin.

Tg, Modulus of Elasticity, and Coefficient of Thermal Expansion Following Final Curing A sample of Example 1 with UV was prepared by irradiating the semiconductor package resin composition of Example 1 with ultraviolet radiation at 500 Mj/cm$^2$ using a low pressure mercury vapor lamp and then carrying out final curing at 165° C. for 2 hours. Another sample using Example 1 without UV was prepared by subjecting the semiconductor package resin composition of Example 1 to final curing at 165° C. for 2 hours without irradiating with ultraviolet radiation. Yet another sample using Comparative Example A with UV was prepared by irradiating the semiconductor package resin composition of Comparative Example A with ultraviolet radiation at 500 Mj/cm$^2$ using a low pressure mercury vapor lamp and then carrying out final curing at 165° C. for 2 hours. The glass transition temperatures (Tg) of these samples were measured using a DMA method and modulus of elasticity at 25° C.

The Tg measurements using the DMA method involved the use of a solid analyzer (RSA-III) manufactured by Rheometric Scientific in a three point curve mode (strain: 0.05%, frequency: 1 Hz). The size of the samples was 2×10×35 mm$^3$, and the samples were heated at a rate of 3° C./minute. Specific modulus of elasticity measurements used the three point curve method and involved placing the above-mentioned cuboid sample (size: 2×10×35 mm$^3$) on two knife edges (separated by 25 mm) and measuring the load used to push down on the central part of the sample, thereby deforming the sample. In this case, the strain was applied as a sine wave having a maximum value of 0.05%, and the load was also measured as a sine wave (the frequency of the sine wave was 1 Hz). The measurement results are shown in Table 3.

TABLE 3

|  | Tg (° C.) | Modulus (GPa) @ 25° C. |
|---|---|---|
| Example 1 with UV | 91 | 9.4 |
| Example 1 without UV | 88 | 9.6 |
| Comparative Example A with UV | 48 | 6.6 |

A sample using Example 1 with UV and a sample using Example 1 without UV were prepared in the same way as described. Their glass transition temperatures (Tg) were measured using a TMA method and coefficients of thermal expansion (CTE).

When measuring Tg using the TMA method and CTE, a TMA 8310 thermomechanical analysis apparatus manufactured by Rigaku Corporation was used. The sample was heated at a rate of 20° C./minute in a nitrogen stream. The measurements were carried out in compression mode, and a load of 10 mN was applied during the measurements. The sample length was measured as a function of temperature, and the coefficient of thermal expansion was obtained from the slope of the function. In addition, the Tg value was obtained from a temperature at which the slope is at a maximum when plotting length vs. temperature. The measurement results are shown in Table 4. α1 and α2 are the coefficients of thermal expansion below and above the Tg value, respectively.

TABLE 4

|  | Tg (° C.) | α1 (ppm) | α2 (ppm) |
|---|---|---|---|
| Example 1 with UV | 84 | 30 | 100 |
| Example 1 without UV | 80 | 30 | 93 |

A sample using Example 1 with UV and a sample using Example 1 without UV were prepared in the same way as described above and measured using a DSC method.

The DSC measurements were carried out using a Pyris 1 manufactured by PERKIN ELMER, and the area of a plot of quantity of heat vs. temperature when the temperature was increased from 50° C. to 300° C. at a rate of increase of 10° C./min was determined and expressed as ΔH. In addition, the peak temperature of this plot was determined. The results are given in Table 5.

TABLE 5

|  | Peak (° C.) | ΔH (J/g) |
|---|---|---|
| Example 1 with UV | 190 | 9 |
| Example 1 without UV | 190 | 11 |

Production of Semiconductor Package

Figure 12:
FIG. 12 is a photograph showing a cross-section of a semiconductor package produced using a semiconductor package production method according to an embodiment of the present invention.

An electronic component (chip) (0.5 mm pitch Plastic BGA manufactured by Top Line) and a 5 mm×5 mm substrate (manufactured by Arm Electronics Co., Ltd.) were prepared, and the semiconductor package resin composition of Example 1 was applied to the surface of the substrate using a dispenser. The chip was mounted on the substrate by identifying the positions of the substrate and the chip by means of an optical unit using a flip chip bonder (MB-4500 manufactured by Nippon Avionics Co., Ltd.) and thermally contact bonding in such a way that the solder balls on the chip lined up with the lands on the substrate. The edge of the semiconductor package resin composition was then subjected to B-stage conversion by irradiating with ultraviolet radiation for 300 seconds using an ultraviolet lamp (FL10BL manufactured by Toshiba Corporation). A semiconductor package was obtained by subjecting the semiconductor package resin composition to final curing by heating for 2 hours in an oven at 150° C. A cross-section of this semiconductor package was cut using a diamond blade and photographed. The photograph is shown in FIG. 12.

By subjecting the edge of the semiconductor package resin composition to B-stage conversion, the position of the semiconductor chip did not shift even when exposed to high temperatures during the final curing. In addition, the time required for the B-stage conversion was extremely short, namely 300 seconds.

Although the present invention has been described with reference to preferred embodiments, workers skilled in the art will recognize that changes may be made in form and detail without departing from the spirit and scope of the invention.

The invention claimed is:

1. A method for producing a semiconductor package comprising:
   providing at least one of an electronic component and a substrate;
   disposing a first semiconductor package resin composition on either or both of the electronic component and the substrate, wherein the semiconductor package resin composition comprising an epoxy resin, a curing agent, inorganic particles, and nano-particles surface treated with a silane that contains a photocrosslinkable group;
   irradiating at least part of the first semiconductor package resin composition with light during a B-stage conversion; and
   curing the first semiconductor package resin composition by heating.

2. The method according to claim 1, wherein the electronic component is a wafer provided with bumps.

3. The method according to claim 2, wherein disposing the first semiconductor package resin composition comprises disposing the first semiconductor package resin composition on a surface of the wafer on which the bumps are provided.

4. The method according to claim 2, wherein irradiating at least part of the first semiconductor package resin composition with light further comprises contact bonding the wafer to the substrate after the B-stage conversion of the first semiconductor package resin composition.

5. The method according to claim 1, further comprising:
disposing a second semiconductor package resin composition on either or both of the electronic component and the substrate, wherein the second semiconductor package resin composition contains an epoxy resin, a curing agent, inorganic particles, and nano-particles surface treated with a silane that contains a photocrosslinkable group; and
curing the second semiconductor package resin composition by heating.

* * * * *